United States Patent [19]

Porcell

[11] Patent Number: 5,017,552

[45] Date of Patent: May 21, 1991

[54] SUPERCONDUCTOR WIRE AND METHOD OF MAKING SAME

[75] Inventor: George Porcell, Riverdale, N.Y.

[73] Assignee: International Superconductor, Riverdale, N.Y.

[21] Appl. No.: 324,390

[22] Filed: Mar. 15, 1989

[51] Int. Cl.$^5$ ............................................. H01B 12/00
[52] U.S. Cl. .......................................... 505/1; 29/599;
174/15.5; 174/125.1; 505/886; 505/887;
505/918
[58] Field of Search ................ 174/15.5, 125.1; 505/1,
505/704, 740, 813, 823, 884, 885, 886, 887, 918;
29/599

[56] References Cited

U.S. PATENT DOCUMENTS

| | | | |
|---|---|---|---|
| 309,439 | 12/1884 | Chillingworth | 29/599 |
| 3,708,606 | 1/1973 | Shattes et al. | 174/15.5 |
| 3,857,173 | 12/1974 | Tachikawa et al. | 174/125.1 X |
| 4,031,310 | 6/1977 | Jachimowicz | 174/15.5 X |

FOREIGN PATENT DOCUMENTS 308905  12/1988  Japan ...................................... 29/599

OTHER PUBLICATIONS

Jin, R. C. et al.; High Tc Superconductors–Composite Wire Fabrication; Appl. Phys lett 51 (3); Jul. 20, 1987.
Sadakata, N. et al, Fabrication and Superconducting Properties of High Tc Oxide Wire; Materials Research Society; Symposium High–Temperature Superconductors; Nov.–Dec. 1987; pp. 293–296.
Yamada, Y; Bulk and Wire Type Y–Ba–Cu Oxide Superconductor.
Yamada, Y; Critical Current Density of Wire Type Y–Ba–Cu Oxide Superconductor; Toshiba R & D Center, 4-1, Ukishima-cho, Kawasaki-ku, Kawaski 211; Apr. 87.
Okada, M. et al.; Fabrication of Ag-Sheathed Ba–Y–Cu Oxide Superconductor Tape; Hitachi Research Lab; Jan. 1988.
Soeta, A. et al; Microstructures of $YBa_2Cu_3O_{7-\delta}$ with Various Critical Current Densities; Hitachi Research Lab; Apr. 5–9, 1988; Materials Research Society; High Temperatre Superconductors II Abstracts.
Numata, K. et al.; Fabrication of Multifilaments, Y–Ba–Cu–O Oxide Superconductors; Appl. Phys. Lett. 52 (26); Jun. 88.

*Primary Examiner*—Morris H. Nimmo
*Attorney, Agent, or Firm*—Herbert Dubno

[57] ABSTRACT

A superconductive wire having an elongated flexible sheath bent into a nonlinear shape and formed with an inwardly extending longitudinal formations which can be grooves. A sintered body of a ceramic superconductive materials fills the sheath and conforms to the shape, the body having formations complementarily interfitting with the formations of the sheath. At least one of the grooves can be formed with a channel through which a cooling medium can be circulated or the grooves can receive a conductive strand or a support rod.

15 Claims, 1 Drawing Sheet

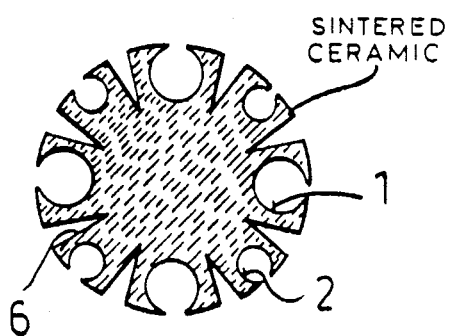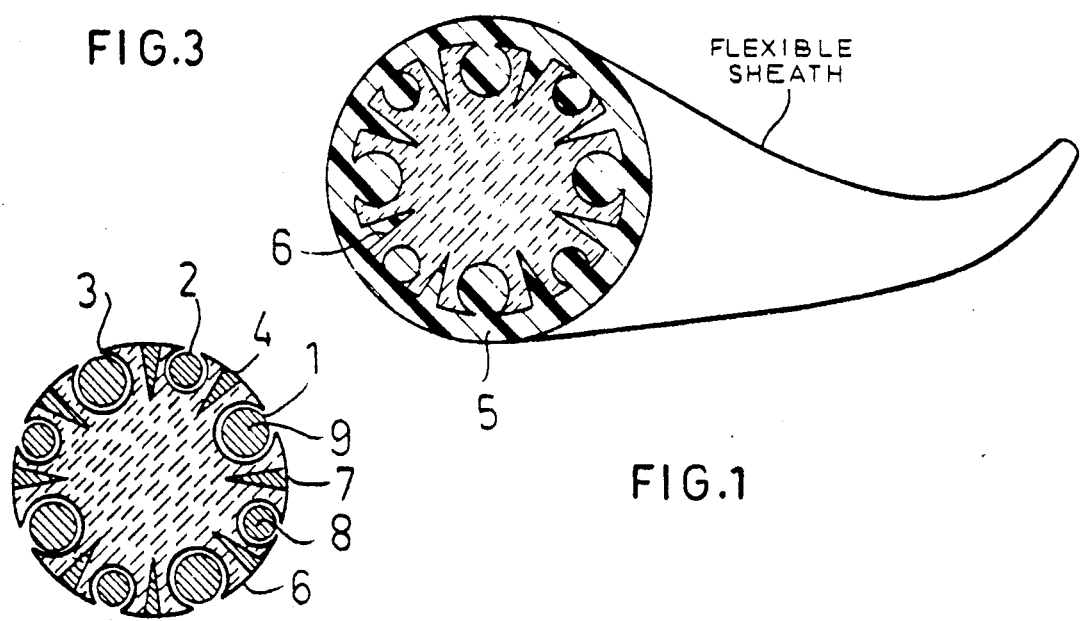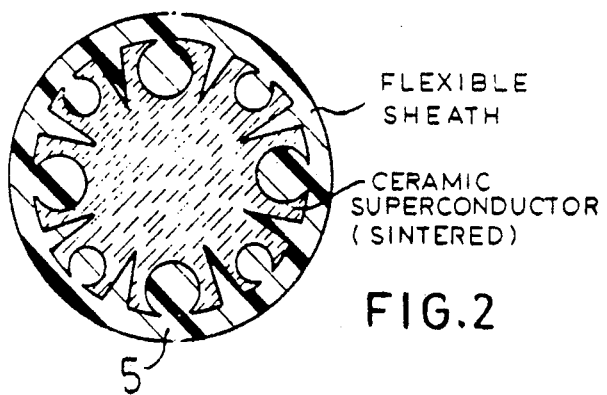

SUPERCONDUCTOR WIRE AND METHOD OF MAKING SAME

FIELD OF THE INVENTION

My present invention relates to a superconducting wire and more specifically to a superconducting wire which can be easily shaped. The invention also relates to a wire incorporating, means for strenghtening and cooling the superconducting material.

BACKGROUND OF THE INVENTION

Superconductivity is a phenomenon which allows the transference of electrical current without the loss of any energy, and in some cases allows the generation of an immensely powerful magnetic filed. Recent discoveries in the field of high temperature superconductivity have indicated that a series of mixed metal oxides that display the mechanical and physical properties of ceramics make superconductivity possible at temperatures far higher than previously thought possible.

Until recently, the only way to produce the phenomenon of superconductivity was to bathe the appropriate metals, initially mercury, tin and lead, and later metallic alloys, in liquid-helium. This exotic liquid is produced by lowering the temperature of rare and costly helium gas to 4.2 Kelvin, or $-452°$ Fahrenheit at which point it liquifies. The process, however, is expensive and requires considerable energy. Furthermore, unless the liquid helium is tightly sealed in a heavily insulated container, it quickly warms and vaporizes. Thus, the practical use of superconductors has been limited to a few devices such as an experimental magnetically levitated train, a few giant particle accelerators, and medical magnetic resonance imaging machines which operate with immense magnetic fields.

Recently, physicists have found that a class of ceramic compounds based upon $YBa_2Cu_3O_7$, wherein Y is yttrium, a rare earth, allows superconductivity to be achieved at a temperature of $98°$ K ($-283°$ F.). The substitution of other rare earths, even magnetic ones, for yttrium, in these ceramic compounds results in very little change in the resulting superconducting properties. This discovery suddenly made superconductivity practical. The problematic liquid helium could now be replaced as a coolant by liquid nitrogen which makes the transition from a gas at an easily produced temperature of $77°$ K ($-320°$ F.). Moreover, liquid nitrogen is much cheaper, longer lasting, and more stable than helium. Further, these ceramics may be able to generate even more intense magnetic fields than metallic superconductors.

The problem is, however, that these ceramic materials are brittle in nature and therefore are difficult to make into flexible and malleable wires that can be used in magnetic coils and electric transmission lines. Additionally, there is a problem in keeping wires cooled to the appropriate temperature needed for superconductivity, and in reinforcing and structurally strengthening the brittle material.

OBJECT OF THE INVENTION

The object of the invention is therefore to maximize the utility and advantages of high temperature superconductivity by making flexible wires that can be used in the manufacture of superconducting cables and magnetic coils. Some of the applications that would be facilitated by this flexible self-cooling superconducting wire would include power transmission lines, superconducting magnets and generators, energy storage devices, particle accelerators, rotating machinery, medical imaging systems, levitated vehicles, and magnetic separators.

SUMMARY OF THE INVENTION

This object is achieved with a superconducting wire which comprises:

an elongated sheath in a nonlinear shape; and
a sintered body of superconductive material filling the sheath and conforming to the shape.

Superconduciting ceramics are normally brittle and cannot be bent once they are fired. This invention allows the superconducting material to be bent into the appropriate shape before it is fired and becomes rigid, useful for example in coils for motors or generators. In addition, this invention will permit the structural strengthening of the brittle ceramic by forming grooves or channels in the ceramic which can be supported with metal strengthening rods or implants. The invention will further allow the superconducting wire to contain channels through which coolant could flow through tubes in order to keep the wires at an appropriate desired temperature for maximizing the effectiveness of superconductivity and allowing for simplicity of design. The invention would additionally allow for the placing of electrical lines that could either be pulled through the preformed channels or poured into the channels of molten state. A non-superconducting electrical current could thereby flow through these wires as a back-up or support mechanism in the event of power fluctuations that could alter the magnetic field. The combined effect of these two power sources would creates a stronger electromagnetic field.

The invention also allows the superconducting ceramic material to contain grooves which would increase the surface area of the wire in order to facilitate the second stage of the fabrication procedure described supra, wherein oxygen flows over or through the grooves or channels in order to facilitate the "sensitization" step in the production of the superconducting material.

BRIEF DESCRIPTION OF THE DRAWING

FIG. 1 is a perspective view partly in section which illustrates the configuration of the extruded sheath of the invention.

FIG. 2 is a cross sectional view which illustrates the extruded sheath of the invention filled with the sintered superconducting material.

FIG. 3 is a cross sectional view which illustrates an alternative embodiment of the invention wherein the extruded sheath is burned from the superconducting material during sintering.

FIG. 4 is a cross sectional view which illustrates the uses for the grooves and channels left within the conducting material during formation.

DETAILED DESCRIPTION OF THE INVENTION

In manufacturing the superconducting material of the invention, one part of the yttrium oxide, $Y_2O_3$ (alpha, 99.99%, e.g.); 2.11 parts cupric oxide, CuO, (Aldrich, reagent grade, e.g.); 3.50 parts barium carbonate, $BaCO_3$, (Baker, reagent grade, e.g.) is mixed together. The materials are ground together with enough acetone to make a thick slurry. The acetone is allowed to completely evaporate. At this point the mixed powder freely flows. The powder is then heated in a furnace at 850° C. in air for one hour and allowed to cool to room temperature. It will be black or green black. When cooled, the powder is reground (no acetone is used) and reheated at 850° C. in air for a five hour period. The mixture is then allowed to cool to room temperature. The now black powder is ground for a third time, this time using acetone, and the acetone is allowed to evaporate completely. The powder is then placed under pressure into a preformed flexible hollow sheath 5 for stabilizing the shape of the superconducting material and allowing the wire to be flexible while the material is in its non-rigid, malleable state, (i.e., while still in a powdered or clay-like form). This sheath can be bent into a variety of shapes including those that could be wound into magnetic coils before the ceramic was fired (or "sintered") at an appropriate temperature (approximately 950° C.) to solidify the superconducting material into a brittle state which conforms to the shape of the inner grooves, channels and configurations in the extruded sheath of FIG. 1. Sintering is a process wherein the material is heated just below the melting point to increase strength and density and to promote intergranular bonding. The sheath could be made of the substance which could or could not be burned off during the sintering process.

An alternative method for forming the flexible, cooled, structurally supported, and electrically enhanced superconducting wire would be to mix the powdered superconducting ceramic with a flexible substrate which would allow the material to be bent into a variety of shapes including those that could be wound around magnetic coils. This would be done before the sintering process. Similar to the sheath method, this combined material containing the ceramic and the flexible substrate could be extruded into a variety of shapes that could contain channels or grooves as shown in FIG. 3. These shapes would be imparted into the fired ceramic conducted wire, regardless of whether or not the sheath or extrusion methods were used. The shapes could form channels or grooves (2) into which conventional electrial conducting material (e.g., copper) could be drawn, placed or poured from a molten state to form the conductors 8. A non-superconducting electrical current could thereby flow through these wires as a back-up or support mechanism in the event of power fluctuations that could alter the magnetic field. The combined effect of these two power sources would create a stronger magnetic field. Other channels (1) in the sintered body of ceramic superconductor 6, could be used for tubing that would allow the passage of liquid hydrogen or nitrogen through the preformed, fired, superconducting ceramic wire to maintain the correct temperature at which the superconducting phenomenon would be maximized, or can receive rods 9. Other grooves (4) could be used for strengthening and structural support by filling them with another material 7 stronger than the ceramic itself (e.g., metal or some other rigid compound). This invention could further allow the superconducting ceramic to contain grooves (3) which would increase the surface area of the wire in order to facilitate the second stage of fabrication wherein oxygen flows over or through the grooves or channels in order to facilitate the sensitizing step in the production of the superconducting material.

In the final stage, the pregrooved, preformed, and sintered wire is place into a quartz tube for the oxygen sensitization stage. That is, the tube containing the sintered wire is put into a furnace from 500°–600° C. and pure oxygen is allowed to pass over the wire for approximately three hours, then allowed to cool to room temperature while maintaining the flow of pure oxygen. After the process is completed, the various aforementioned enhancements would be made.

We claim:

1. A superconductive wire, comprising:
   an elongated flexible sheath bent into a nonlinear shape having inwardly extending longitudinal formations directed toward a center of the sheath; and
   a sintered body of a ceramic superconductive material filling said sheath and conforming to said shape, said body having formations complementarily interfitting with the formations of said sheath whereby said body is formed with grooves, at least one of said grooves being formed with a channel through which a cooling medium can be circulated.

2. A superconductive wire, comprising:
   an elongated flexible sheath bent into a nonlinear shape having inwardly extending longitudinal formations directed toward a center of the sheath; and
   a sintered body of a ceramic superconductive material filling said sheath and conforming to said shape, said body having formations complementarily interfitting with the formations of said sheath whereby said body is formed with grooves, a conductive strand being received in at least one of said grooves.

3. A superconductive wire, comprising:
   an elongated flexible sheath bent into a nonlinear shape having inwardly extending longitudinal formations directed toward a center of the sheath; and
   a sintered body of a ceramic superconductive material filling said sheath and conforming to said shape, said body having formations complementarily interfitting with the formations of said sheath whereby said body is formed with grooves, a support rod being received in at least one of said grooves.

4. A superconductive wire comprising an elongated sintered body of copper oxide based sintered ceramic superconductive material formed along its periphery with a plurality of longitudinally extending grooves.

5. The superconductive wire defined in claim 4 wherein each of said grooves is formed in an axially extending rib of said body projecting radially therefrom, said ribs being angularly spaced around the periphery of said body.

6. The superconductive wire defined in claim 5 wherein at least one of said grooves is formed with a channel through which a cooling medium can be circulated.

7. The superconductive wire defined in claim 5 wherein a conductive strand is received in at least one of said grooves.

8. The superconductive wire defined in claim 5 wherein a support rod is received in at least one of said grooves.

9. A method of making a superconductive wire, comprising the steps of:
   (a) filling an elongated deformable sheath with a sinterable mass of a composition adapted to form a ceramic superconductive material upon sintering;
   (b) bending said sheath filled with said mass into a nonlinear shape;

(c) sintering said mass into a superconductive body of said shape; and (d) burning off said sheath from said body.

10. The method defined in claim 9 wherein said material is an oxide-type ceramic superconductor, further comprising the step of contacting said body with oxygen at an elevated temperature to adjust the oxygen content of said body.

11. The method defined in claim 10 wherein said sheath is burned off said body during said contact of said body with oxygen at said elevated temperature.

12. The method defined in claim 9 wherein said sheath is formed with inwardly extending longitudinal formations directed toward a center of said sheath to form in said body formations complementarily interfitting with the formations of said sheath whereby said body is formed with grooves.

13. The method defined in claim 12 wherein at least one of said grooves is formed with a channel through which a cooling medium can be circulated.

14. The method defined in claim 12 wherein a conductive strand is inserted in at least one of said grooves.

15. The method defined in claim 12 wherein a support rod is inserted in at least one of said grooves.

* * * * *